(12) United States Patent
Kanai et al.

(10) Patent No.: US 6,988,233 B2
(45) Date of Patent: Jan. 17, 2006

(54) DECODING DEVICE AND DECODING METHOD

(75) Inventors: Hirokazu Kanai, Yokosuka (JP); Hajime Kuriyama, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 500 days.

(21) Appl. No.: 10/181,798

(22) PCT Filed: Nov. 28, 2001

(86) PCT No.: PCT/JP01/10362

§ 371 (c)(1),
(2), (4) Date: Jul. 23, 2002

(87) PCT Pub. No.: WO02/45272

PCT Pub. Date: Jun. 6, 2002

(65) Prior Publication Data

US 2003/0009719 A1    Jan. 9, 2003

(30) Foreign Application Priority Data

Nov. 30, 2000  (JP) .............................. 2000-366347

(51) Int. Cl.
    *H03M 13/00*    (2006.01)
(52) U.S. Cl. ...................................... 714/755; 714/758
(58) Field of Classification Search ................ 714/755, 714/752, 746, 751, 758
    See application file for complete search history.

(56) References Cited

FOREIGN PATENT DOCUMENTS

| JP | 2000-183758 | * | 6/2000 |
| JP | 2000183758 |   | 6/2000 |
| JP | 2000-201085 | * | 7/2000 |
| JP | 2000201085 |   | 7/2000 |
| JP | 2000216689 |   | 8/2000 |
| JP | 2001060879 |   | 3/2001 |
| JP | 2001230677 |   | 8/2001 |
| JP | 2001237753 |   | 8/2001 |
| JP | 2001333052 |   | 11/2001 |
| WO | 0 027037 |   | 5/2000 |

OTHER PUBLICATIONS

International Search Report dated Jan. 29, 2002.
C. Berrou, et al.; "Near Optimum Error Correcting Coding And Decoding: Turbo-Codes", IEEE Transactions on Communications, vol. 44, No. 10, Oct. 1996, pp. 1261-1271.
A. Fujiwara, et al.: "Performance of Turbo codes applied to W-CDMA", IEICE, SST97-77, SANE97-102, Dec. 1997, pp. 19-24 with English Abstract.
Japanese Office Action dated Jul. 27, 2004 with English translation.

* cited by examiner

*Primary Examiner*—Albert Decady
*Assistant Examiner*—Dipakkumar Gandhi
(74) *Attorney, Agent, or Firm*—Stevens, Davis, Miller & Mosher, LLP

(57) ABSTRACT

A decoding apparatus and decoding method for performing iteration decoding the suitable number of iterations, and thereby securing the desired transmission quality while decreasing the processing delay. Turbo decoder 301 iterates error correcting decoding on input coded sequences. Error checker 302 decodes an error detecting code contained in a decoded result of the error correcting decoding, and checks whether or not an error remains in the decoded result in turbo decoder 301. Iteration controller 303 instructs turbo decoder 301 to continue the iteration decoding until the number of iterations in the iteration decoding is more than or equal to the constraint number of iterations and error checker 302 determines no error in the decoded result.

8 Claims, 11 Drawing Sheets

| THE NUMBER OF ITERATIONS | ERROR DETECTING CODE #1 | ERROR DETECTING CODE #2 | ERROR DETECTING CODE #3 | ERROR DETECTING CODE #4 |
|---|---|---|---|---|
| INITIAL VALUE | 0 | 0 | 0 | 0 |
| 1 | 1 | 0 | 0 | 0 |
| 2 | 1 | 0 | 0 | 1 |
| 3 | 1 | 1 | 0 | 1 |
| 4 | 1 | 1 | 0 | 1 |
| 5 | 1 | 1 | 0 | 1 |
| 6 | | 1 | 1 | 1 |
| 7 | | | | |
| 8 | | | | |

UPDATE

FIG.11

DECODING DEVICE AND DECODING METHOD

TECHNICAL FIELD

The present invention relates to a decoding apparatus and decoding method for iterating decoding on a coded sequence obtained by performing error detecting coding and error correcting coding on information bits, and more particularly, to a decoding apparatus and decoding method for decoding a coded sequence subjected to error correcting coding by turbo code.

BACKGROUND ART

In a mobile communication field, techniques have been studied increasingly for detecting and correcting errors caused by, for example, noise on a transmission path. Particularly in digital communications, error control techniques have been used widely for correcting errors that cannot be recovered in signal processing such as equalization and diversity. Such error control techniques are primarily separated into Automatic Repeat reQuest (ARQ) and Forward Error Correction (FEC). ARQ is a technique in which a coded sequence obtained by performing error detecting coding on information bits is transmitted, and an erroneous information bit is repeated according to a repeat request from a receiving side, thereby assuring the reliability of decoded results. On the other hand, FEC is a technique in which a transmitting side transmits a coded sequence obtained by performing error correcting coding on information bits, and a receiving side corrects errors contained in received signals. FEC is effective particularly in a communication system with no feedback channel for repeat request or in a communication system permitting no delay due to repeat.

As one of error correcting codes in FEC, convolutional code has been known. A coder for performing convolutional coding is generally composed of a shift register and adder for performing mod2 operation. When an information bit sequence with m bits is input to the coder, the information bit sequence with m bits is subjected to convolution and an information bit sequence with n bits is output (n>m). Since a redundant bit sequence with "n−m" bits is thereby added to the information bit sequence with m bits, it is possible to decrease the error rate in decoding.

In recent years, among aforementioned error correcting codes, attention has been drawn to the turbo code as a code approaching Shannon limit known as a limit of logical transmission rate enabling information to be transmitted with no errors. The conventional turbo code is described, for example, in "Near Optimum Error Correcting Coding and Decoding: Turbo-codes (IEEE Transaction on Communications, Vol. 44, No. 10, October 1996)" and "Effect of Applying Turbo code to W-CDMA" (IEICE, Technical Report, pages 19 to 24, December 1997). As described in these documents, the error correcting coding of information bit sequence in the turbo code is performed in a turbo coder comprised of parallel-arranged two or more convolutional coders and an interleaver for rearranging an information bit sequence. The decoding of turbo code is performed by iterating the error correcting decoding in a turbo decoder provided at a receiving side. The turbo decoder has a configuration corresponding to the turbo coder at the transmitting side.

As an example of the aforementioned turbo coder, a turbo coder with a coding rate of 1/3 will be described below. The turbo coder with a coding rate of 1/3 has parallel-arranged two convolutional coders. An information bit sequence input to the turbo coder is distributed to three routes. In a first route the input information bit sequence is output as coded sequence u without undergoing any change. In a second route the input information bit sequence undergoes error correcting coding in a convolutional coder and output as coded sequence y1. In a third route the input information bit sequence undergoes rearrangement in an interleaver, then undergoes error correcting coding in a convolutional coder, and is output as coded sequence y2. These coded sequences u, y1 and y2 output from the turbo coder undergo predetermined radio transmission processing, and are transmitted as radio signals. The transmitted radio signals of coded sequences u, y1 and y2 are usually given noises on a transmission path, and received in a reception apparatus provided with the turbo decoder.

In the reception apparatus, coded sequences containing coded sequences u, y1 and y2 transmitted from transmission-apparatus and each given noises on the transmission path are received and input to the turbo decoder. Herein, a received coded sequence of coded sequence u given noises on the transmission path is referred to as coded sequence U, a received coded sequence of coded sequence y1 given noises on the transmission path is referred to as coded sequence Y1, and a received coded sequence of coded sequence y2 given noises on the transmission path is referred to as coded sequence Y2.

The turbo decoder will be described below. The turbo decoder is comprised of a soft-output decoder that calculates soft-decision values using a soft-output decoding algorithm such as MAP decoding (Maximum A Posteriori Probability decoding) and SOVA (Soft Output Viterbi Algorithm), an interleaver that performs the same rearrangement as in the interleaver provided at the transmitting side, and a deinterleaver that obtains the original arrangement of the information bit sequence rearranged in the interleaver. A same number of soft-output decoders are provided as convolutional coders at the transmitting side. In addition, it may be possible to use a soft-output decoder on a time-division basis in decoding, and thereby configure a turbo decoder provided with a fewer number of soft-output decoders than convolutional coders.

In the turbo decoder, error correcting decoding is iterated using coded sequence U, two redundant bits of coded sequence Y1 and coded sequence Y2, and prior likelihood obtained as feedback from a soft-output decoded result of last iteration. Hereinafter, in the specification, iterating error correcting decoding on a coded sequence is referred to as "iteration decoding". FIG. 1 illustrates the relationship between BER (Bit Error Rate) of decoded results obtained by performing the iteration decoding in the turbo decoder and SNR (Signal to Noise Ratio) for each iteration. As illustrated in the figure, iterating decoding decreases BER even when SNR is the same (i.e., the transmission path environment is the same). In other words, the turbo decoding iterates decoding, and thereby achieves high error correcting capability and high transmission quality.

In addition, since a number of iterations are needed to obtain high transmission quality in the aforementioned turbo decoding, when the turbo coding/turbo decoding is applied to a communication system requiring high transmission quality, such a problem arises that increased iterations increase the processing delay and power consumption. With respect to the problem, a technique for optimizing the iterations in the iteration decoding is disclosed in Japanese Laid-Open Patent Publication 2000-183758 ("Decoding Apparatus and Decoding Method, and Coding Apparatus and Coding Method"). The decoding apparatus disclosed in aforementioned Japanese Laid-Open Patent Publication 2000-183758 checks an error remaining in a decoded result whenever decoding is iterated, and when determining there is no error, finishes the iteration decoding. It is thereby possible to secure desired transmission quality and suppress processing delay caused by performing unnecessary iteration decoding.

However, the technique disclosed in Japanese Laid-Open Patent Publication 2000-183758 has such a problem that when an error cannot be detected (an overlooked error occurs) despite the error remaining in a decoded result, the iteration decoding is finished while the error remains in the decoded result, and thereby transmission quality is decreased.

Further, as a technique for optimizing the iterations in the iteration decoding, besides the technique disclosed in Japanese Laid-Open Patent Publication 2000-183758, there is known a technique for iterating decoding on an error correcting code containing a plurality of error detecting codes, decoding all the error detecting codes contained in decoded results to check an error, and when determining that no error is contained in each of all the checked error detecting codes, finishing the iteration decoding. According to such a technique, the iteration decoding is finished only when no errors are determined in the same number of iterations of the iteration decoding with respect to all the error detecting codes contained in the error correcting code, and it is thereby possible to reduce the risk of occurrence of overlooked error. It is because in decoding of convolutional code, a remaining error has the correlation in the code, and therefore, it is expected a probability of overlooked error decreases when a plurality of error detection indicates no error in the same number of iterations, as compared to the detection using a single error detecting code. However, such a technique for using a plurality of error detecting codes reduces the risk that the transmission quality deteriorates due to overlooked error, but increases the number of iterations because the iteration decoding is continued until no errors are determined in all the error detecting codes contained in the error correcting code, and thereby has a problem that processing delay and power consumption is increased.

Further, as a technique for optimizing the number of iterations in the iteration decoding, a technique is known of iterating decoding the predetermined number of times. However, in decoding of the turbo code, as illustrated in FIG. 1, statistically BER is improved as the number of iterations is increased, but there is such a characteristic that with a single error correcting code noted, further continuing the iteration decoding after detecting no error in some number of iterations sometimes generates an error again. Therefore, in the technique for iterating decoding the predetermined number of times, since the decoding is iterated always the predetermined number of times even when no error is detected in a decoded result during the iterations, there is a case that an error occurs again in an information bit sequence in which no error is once detected during the iterations. In other words, the method of iterating decoding the predetermined number of times has problems that a finally obtained decoded result is not always a decoded result with the least errors, and processing delay and power consumption is increased because unnecessary error correcting decoding is iterated.

DISCLOSURE OF INVENTION

It is an object of the present invention to provide a decoding apparatus and decoding method for performing iteration decoding the suitable number of times, and thereby capable of securing desired transmission quality while decreasing processing delay.

According to one aspect of the present invention, a decoding apparatus has an iteration decoding section that iterates error correcting decoding on a coded sequence obtained by performing error detecting coding and error correcting coding on information bits, a check section that checks whether or not an error remains in a result of the error correcting decoding using an error detecting code contained in the result of the error correcting decoding obtained in the iteration decoding section, and a control section that makes the iteration decoding section perform the error correcting decoding until the number of iterations in the iteration decoding section is more than or equal to the constraint number of iterations.

BRIEF DESCRIPTION OF DRAWINGS

FIG. 11 is a table illustrating an example of updating processes of error check result flags stored in flag memory 802.

BEST MODE FOR CARRYING OUT THE INVENTION

It is a first subject matter of the present invention to continue, at a stage of the small number of iterations in the iteration decoding, the iteration decoding even when any error is not detected from a decoded result of the iteration decoding and thereby prevent transmission quality from deteriorating due to overlooked error. Specifically, the first subject matter of the present invention is to set the constraint number of iterations, and perform the iteration decoding until the number of iterations exceeds the constraint number of iterations and any error is not detected from a decoded result.

It is a second subject matter of the present invention to check whether or not an error remains in a decoded result of iteration decoding using a plurality of error decoding codes contained in the decoded result of the iteration decoding, and perform the iteration decoding until no error is determined in each of all the checked error detecting codes at least once during the iteration decoding.

Embodiments of the present invention will be described below with reference to accompanying drawings. The embodiments explain the turbo decoding as an example of the iteration decoding.

(Embodiment 1)

Figure 2:
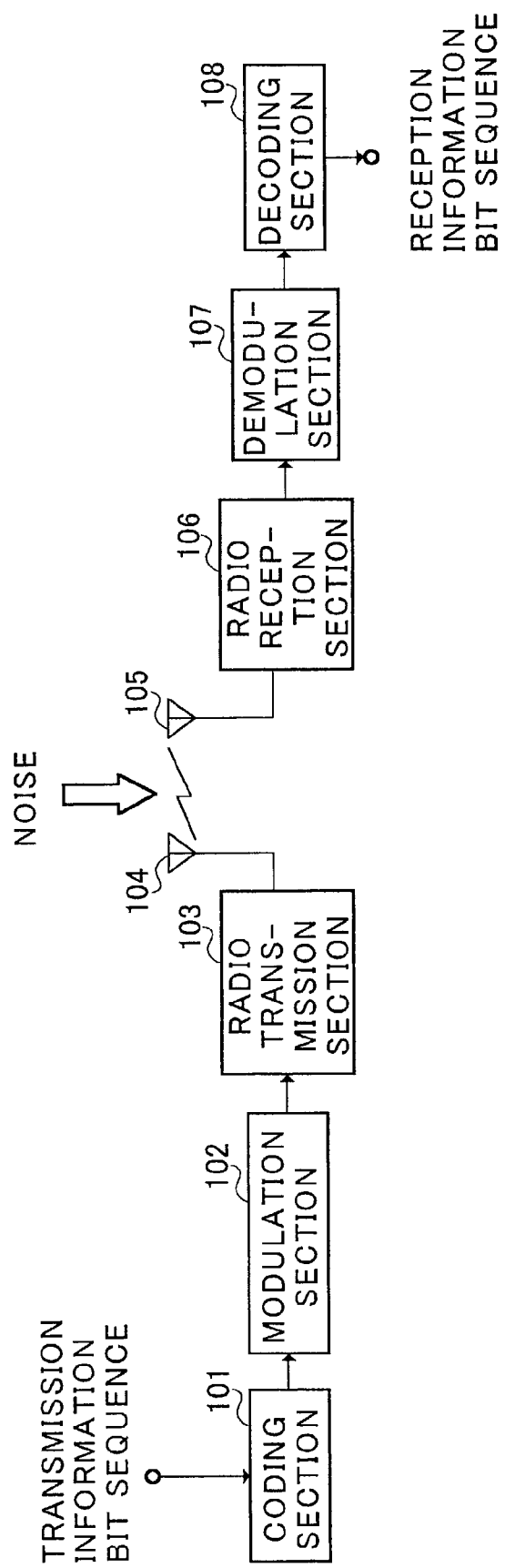
FIG. 2 is a block diagram illustrating a configuration of a radio communication system according to Embodiment 1 of the present invention.

FIG. 2 is a block diagram illustrating a configuration of a radio communication system according to Embodiment 1 of the present invention. As illustrated in the figure, in a data transmission apparatus according to this embodiment, coding section 101 performs error detecting coding and error correcting coding on a transmission information bit sequence provided from an information source not shown, modulation section 102 modulates the coded sequence, radio transmission section 103 performs radio transmission processing on the modulated sequence, and radio signals are transmitted from transmission antenna 104. At a receiving side, radio reception section 106 performs radio reception processing on signals (coded sequence) received in antenna 105, demodulation section 107 demodulates the signals, and decoding section 108 performs error correcting decoding on the resultant to obtain a received information bit sequence. A cyclic code is typically used as an error detecting code used in coding section 101. It is assumed in this embodiment that a turbo coder provided in coding section 101 performs the error correcting coding.

Figure 3:
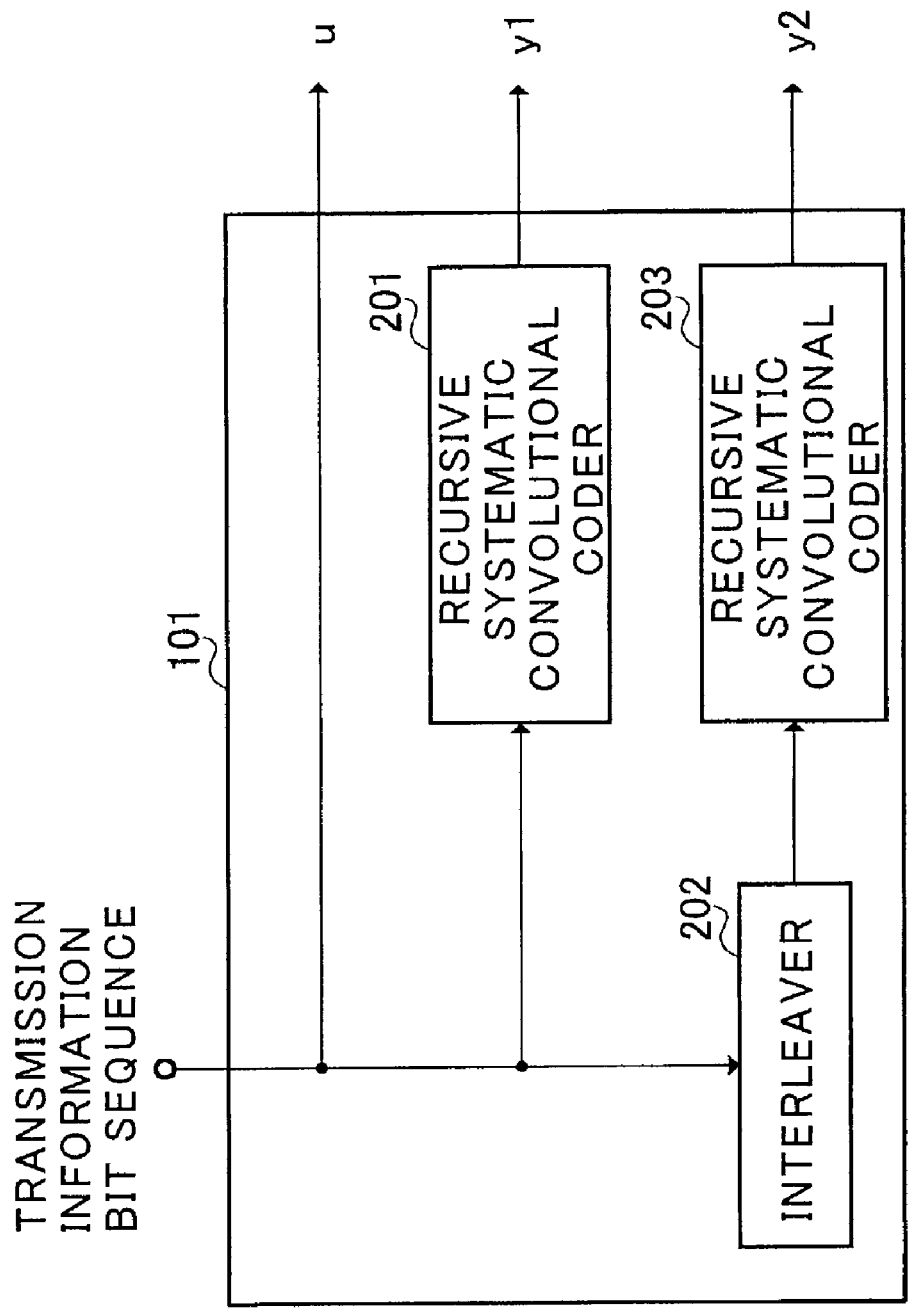
FIG. 3 is a block diagram illustrating a configuration of a turbo coder provided in coding section 101 according to Embodiment 1 of the present invention.

FIG. 3 is a block diagram illustrating a configuration of a turbo coder provided in coding section 101. As illustrated in the figure, the turbo coder is provided with recursive systematic convolutional coder 201, interleaver 202 that rearranges a transmission information bit sequence, and recursive systematic convolutional coder 203. Recursive systematic convolutional coders 201 and 203 perform systematic convolutional coding, and thereby have more excellent error rates than performing non-systematic convolutional coding.

In the turbo coder, the transmission information bit sequence is output as coded sequence u without undergoing any change, while being input to recursive systematic convolutional coder 201 and to interleaver 202. Recursive systematic convolutional coder 201 performs convolutional coding on the input information bit sequence to generate coded sequence y1. Interleaver 202 rearranges the input information bit sequence to output to recursive systematic convolutional coder 203. Recursive systematic convolutional coder 203 performs convolutional coding on the information bit sequence output from interleaver 202 to generate coded sequence y2. Modulation section 102 modulates coded sequence u, coded sequence y1 and coded sequence y2, radio transmission section 103 performs the predetermined radio transmission processing on modulated sequences, and radio signals are transmitted from antenna 104. The radio signals of coded sequences u, y1 and y2 are given noises on a transmission path, and received in antenna 105.

At a receiving side, radio signals of coded sequences containing coded sequences u, y1 and y2 transmitted from transmission-apparatus and each given noises on the transmission path are received in antenna 105, radio reception section 106 performs radio reception processing on the radio signal, and demodulation section 107 demodulates the resultant to output to decoding section 108. Herein, a received coded sequence of coded sequence u given noises on the transmission path is referred to as coded sequence U, a received coded sequence of coded sequence y1 given noises on the transmission path is referred to as coded sequence Y1, and a received coded sequence of coded sequence y2 given noises on the transmission path is referred to as coded sequence Y2.

Figure 4:
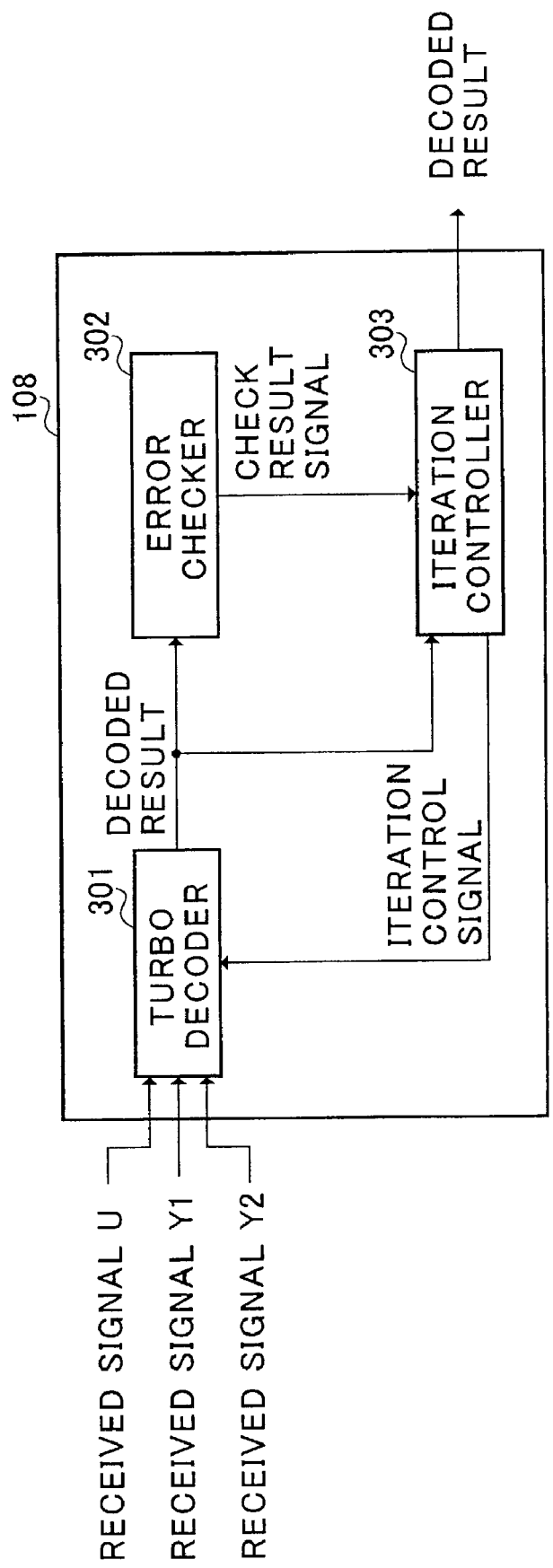
FIG. 4 is a block diagram illustrating a configuration of decoding section 108 according to Embodiment 1 of the present invention.

FIG. 4 is a block diagram illustrating a configuration of decoding section 108. Turbo decoder 301 iterates error correcting decoding on the received coded sequences, and outputs decoded results to error checker 302 and iteration controller 303 every time the error correcting decoding is performed. In addition, a decoded result output from turbo decoder 301 is obtained as a coded information bit sequence (i.e., error detecting code). The number of iterations is controlled by iteration controller 303 described later. Error checker 302 performs error detection on the decoded result (error detecting code) output from turbo decoder 301, thereby checks whether an error is contained in the decoded result, and outputs a check result signal (OK signal or NG signal) indicative of the check result to iteration controller 303. When determining there is an error, error checker 302 outputs a NG signal to iteration controller 303, while outputting an OK signal to iteration controller 303 when determining there is no error. Iteration controller 303 determines whether turbo decoder 301 continues or finishes the iteration decoding, and when finishing the iteration, controls turbo decoder 301 to finish the iteration decoding. Iteration controller 303 will be described later.

Figure 5:
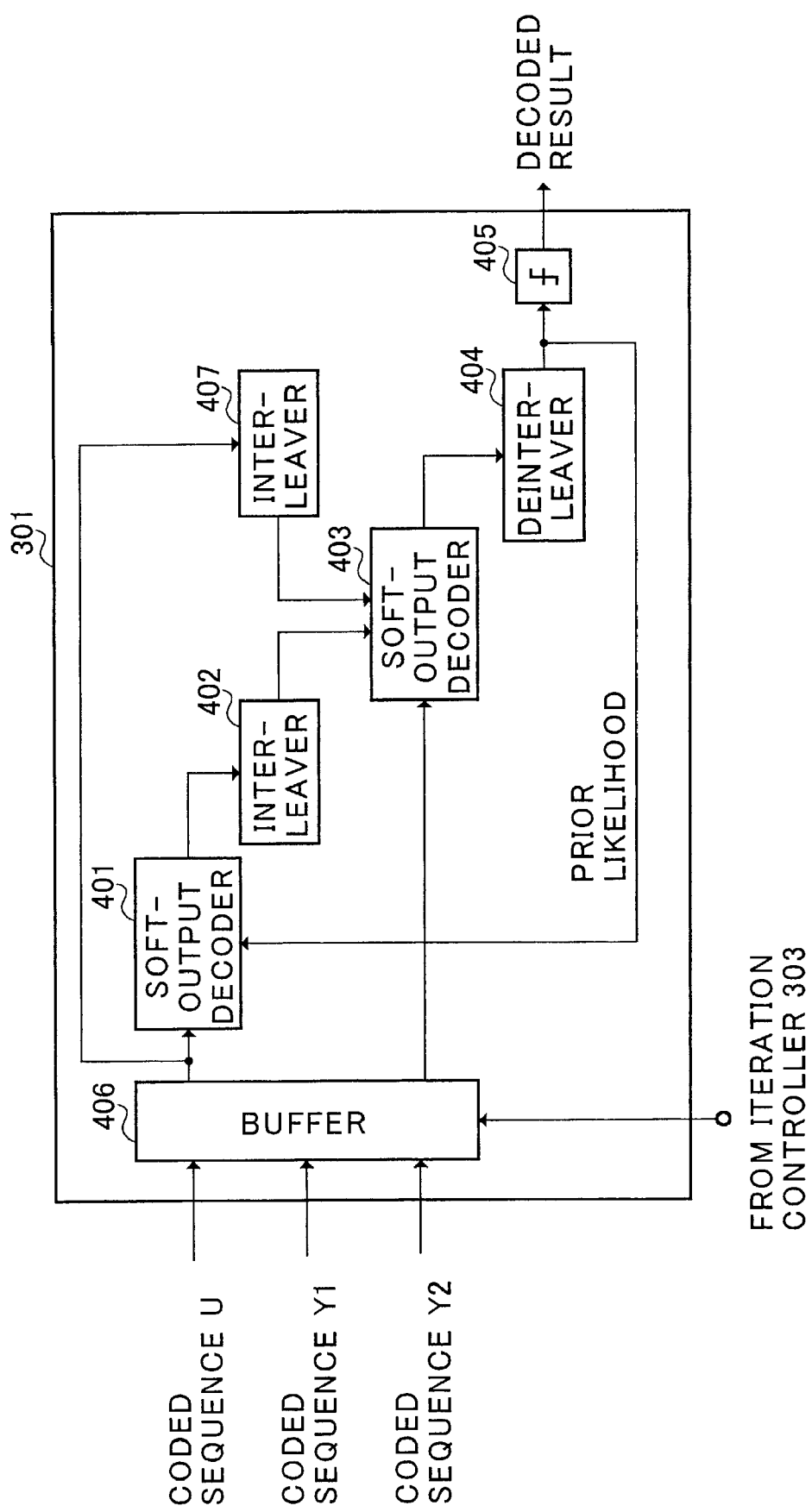
FIG. 5 is a block diagram illustrating a configuration of turbo decoder 301 according to Embodiment 1 of the present invention.

Turbo decoder 301 will be described below with reference to FIG. 5. FIG. 5 is a block diagram illustrating a configuration of turbo decoder 301 according to Embodiment 1 of the present invention. Coded sequences U, Y1 and Y2 are input to turbo decoder 301 and stored in buffer 406.

Buffer 406 outputs coded sequences U, Y1 and Y2 to soft-output decoder 401. Soft-output decoder 401 calculates by soft-output decoding a soft-output decoded result based on coded sequences U and Y1 output from buffer 406 and on prior likelihood that is a last decoded result output from deinterleaver 404, and outputs the result to interleaver 402. In addition, in the first iteration, since a last decoded result does not exist, the prior likelihood is set at 0. Interleaver 402 performs interleaving on a soft-output decoded result from soft-output decoder 401 in the same way as in interleaver 202 provided in the turbo coder at the transmitting side, and outputs the resultant to soft-output decoder 403 as prior likelihood. Buffer 406 outputs coded sequence U to interleaver 407. Interleaver 407 performs interleaving on coded sequence U in the same way as in interleaver 202 provided in the turbo coder at the transmitting side, and outputs interleaved coded sequence U' to soft-output decoder 403. Buffer 406 outputs coded sequence Y2 to soft-output decoder 403. Soft-output decoder 403 performs soft-output decoding based on prior likelihood and coded sequence U' respectively output from interleavers 402 and 407 and coded sequence Y2, and thereby generates a soft-output decoded result to output to deinterleaver 404.

Deinterleaver 404 performs deinterleaving on the soft decision value output from soft-output decoder 403, and thereby obtains the original arrangement of the information bit sequence interleaved in interleaver 402. Hard-decision determiner 405 makes a hard decision on the deinterleaved soft-output decoded result to transform to a hard decision value of "0" or "1". The hard decision value becomes a decoded result in turbo decoder 301. In addition, the hard decision value at this stage contains redundant bits added in error detecting coding. Further, the soft-output decoded result deinterleaved in deinterleaver 404 is output as prior likelihood to soft-output decoder 401 as feedback.

According to a series of soft-output decoding performed in a feedback circuit comprised of aforementioned soft-output decoder 401, interleaver 402, soft-output decoder 403, and deinterleaver 404, the coded sequences undergo error correcting decoding. The iteration decoding is performed by iterating the series of soft-output decoding in the feedback circuit comprised of soft-output decoder 401, interleaver 402, soft-output decoder 403, and deinterleaver 404. When iteration controller 303 controls so as to finish the iteration decoding, a hard decision result output from hard-decision determiner 405 is set as a final decoded result, and the decoding is finished.

Figure 1:
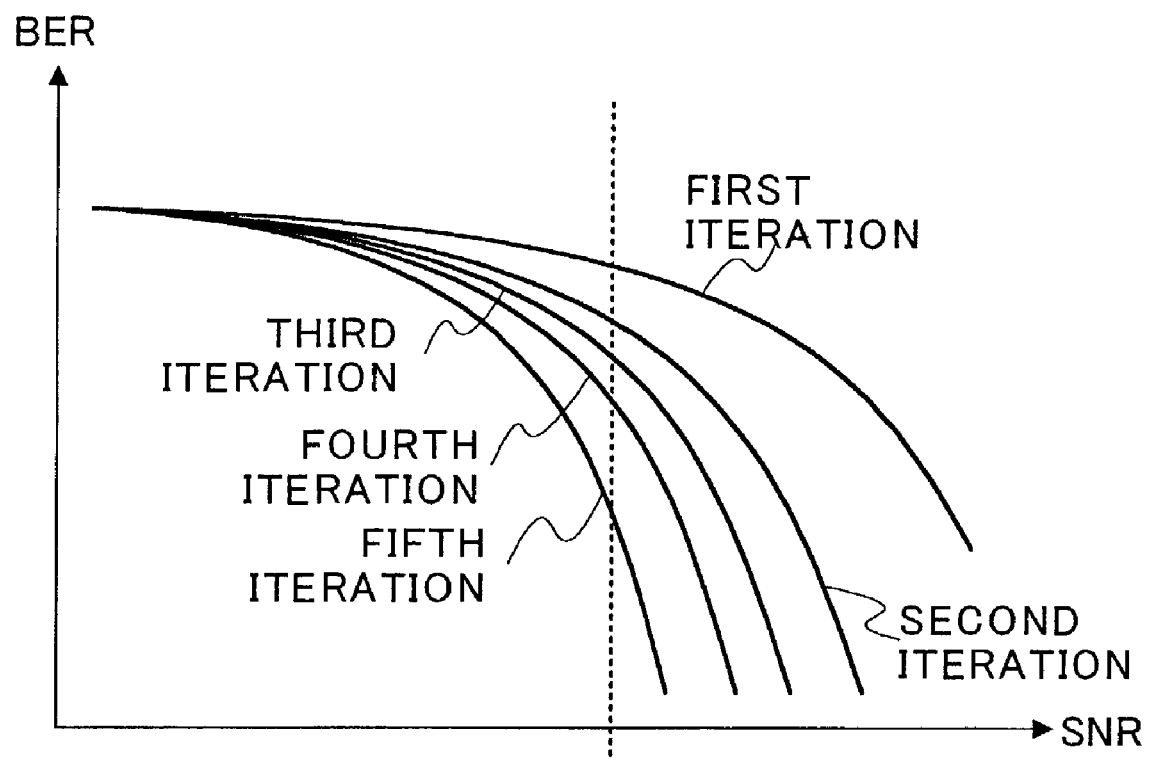
FIG. 1 is a graph illustrating the relationship between BER of decoded results of iteration decoding in a turbo decoder and SNR for each iteration.

Thus, turbo decoder 301 performs the iteration decoding using coded sequences U, Y1 and Y2. FIG. 1 illustrates the relationship between BER (Bit Error Rate) of decoded results of iteration decoding in the turbo decoder and SNR (Signal to Noise Ratio) for each iteration. As illustrated in FIG. 1, iterating decoding decreases BER even when SNR is the same (i.e., the transmission path environment is the same). In other words, the turbo decoding iterates decoding, and thereby achieves high error correcting capability and high transmission quality.

Figure 6:
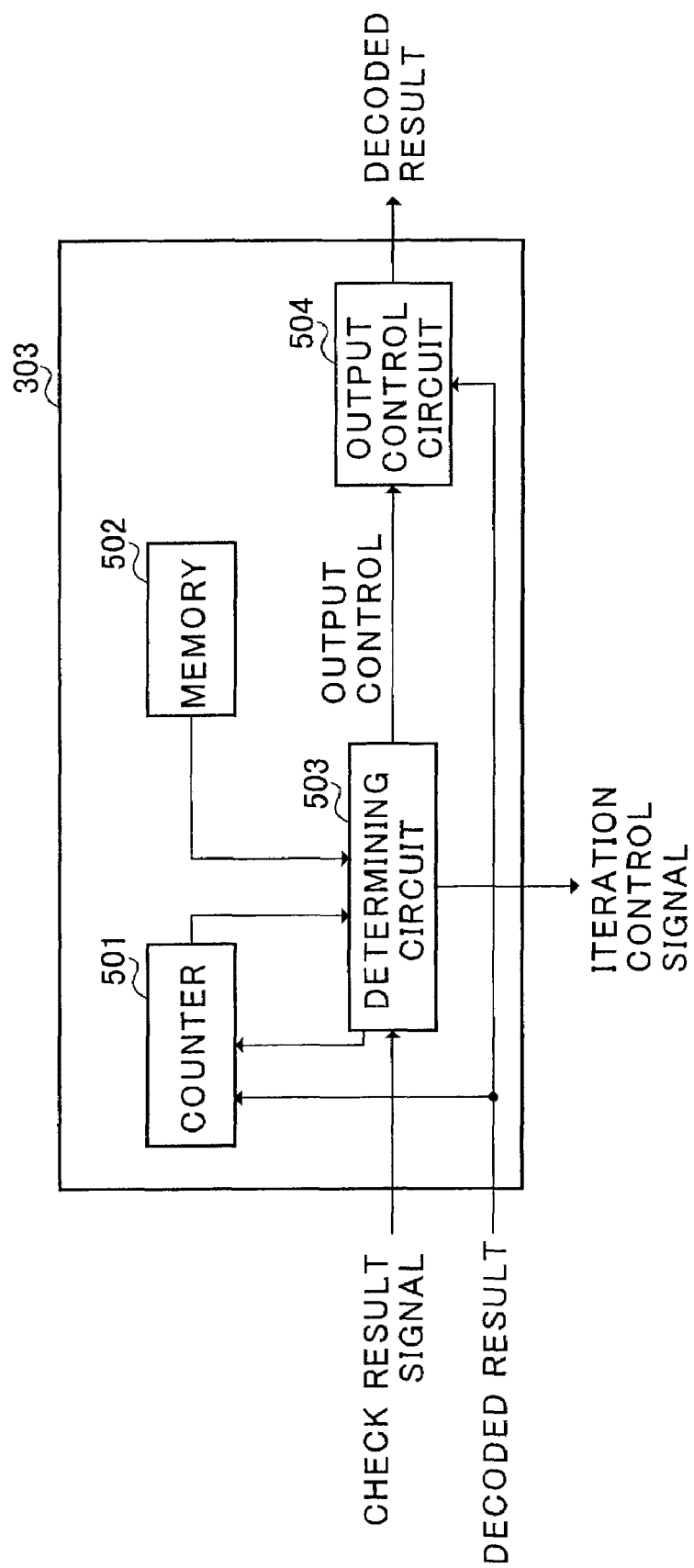
FIG. 6 is a block diagram illustrating a configuration of iteration controller 303 according to Embodiment 1 of the present invention.

FIG. 6 is a block diagram illustrating a configuration of iteration controller 303. Iteration controller 303 is primarily comprised of counter 501 that counts the number of iterations in turbo decoder 301, memory 502 that stores "the constraint number of iterations" of the number of iterations in turbo decoder 301, determining circuit 503 that determines whether or not finish the iteration decoding in turbo decoder 301, and output control circuit 504 that receives a decoded result in turbo decoder 301 and corresponding to control of determining circuit 503, controls whether or not to output the decoded result to a decoded result output memory not shown.

The operation of iteration controller 303 will be described. Counter 501 counts the number of iterations in decoding in turbo decoder 301 to output to determining circuit 503. Counter 501 is set for an initial value of "1", and when receiving a decoded result of a first iteration from turbo decoder 301, outputs the initial value of "1" to determining circuit 503. Further, counter 501 updates the set value from "1" to "2" while outputting "1" to determining circuit 503. Next, when receiving a decoded result of a second iteration from turbo decoder 301, counter 501 outputs the set value of "2" to determining circuit 503, and updates the set value from "2" to "3" while outputting "2". Thus, counter 501 outputs the set value to determining circuit 503 whenever a decoded result is output from turbo decoder 301, while incrementing the set value to set as a new set value. Further, when determining circuit 503 determines to finish the iteration decoding, counter 501 resets the set value according to the control of determining circuit 503, and sets the set value to the initial value of "1". In this way, counter 501 outputs the set value corresponding to the number of iterations in error correcting coding in turbo decoder 301 to determining circuit 503.

"The constraint number of iterations" of the number of iterations in turbo decoder 301 is stored in memory 502. Determining circuit 503 reads "the constraint number of iterations" from memory 502 to compare with the number of iterations of error correcting decoding in turbo decoder 301 indicated by an output signal from counter 501, only when the number of actual iterations (set value output from counter 501) is more than or equal to "the constraint number of iterations", determining circuit 503 judges the presence or absence of error in a decoded result output from turbo decoder 301, and determines whether or not to finish the iteration decoding. In other words, when the number of actual iterations is less than "the constraint number of iterations", since such a possibility is high that a checked result in error checker 302 is malpractice, determining circuit 503 does not make a determination as to whether to finish the iteration decoding. Therefore, when the number of actual iterations is less than "the constraint number of iterations", the control for finishing the iteration decoding is not performed, and turbo decoder 301 continues the iteration decoding up to the number of iterations more than or equal to the constraint number of iterations as the minimum number of iterations. Determining circuit 503 determines whether or not to finish the iteration decoding, referring to the number of iterations output from counter 501, the constraint number of iterations of the number of iterations output from memory 502, and a check result signal (OK signal or NG signal) output from error checker 302.

When the number of actual iterations is not less than "the constraint number of iterations", determining circuit 503 instructs output control circuit 504 to output a decoded result output from turbo decoder 301 to the decoded result output memory not shown. When receiving an output instruction from determining circuit 503, output control circuit 504 outputs a decoded result output from turbo decoder 301 to the decoded result output memory not shown. Thus, the write in the decoded result output memory is not performed in the number of iterations less than the constraint number of iterations, and it is thereby possible to reduce power consumption due to wasteful memory write. When the number of actual iterations is not less than "the constraint number of iterations" and an output signal from error checker 302 is an OK signal, determining circuit 503 provides turbo decoder 301 with control for finishing the iteration decoding on a current coded sequence. When the number of actual iterations is not less than "the constraint number of iterations" and an output signal from error checker 302 is a NG signal, determining circuit 503 does not perform the control for finishing the iteration decoding. In this case, determining circuit 503 provides turbo decoder 301 with control for continuing the iteration decoding. In this way, determining circuit 503 makes turbo decoder 301 perform the iteration decoding until the number of iterations becomes more than or equal to the constraint number of iterations and no error is detected in a decoded result. According to the control of determining circuit 503, turbo decoder 301 continues the iteration decoding when the number of iterations is less than "the constraint number of iterations".

In addition, this embodiment describes continuing the iteration decoding until the number of iterations becomes more than or equal to the constraint number of iterations and no error is detected in a decoded result. However, it may be also possible to set an upper limit of the number of iterations, and when no error is not detected until the upper-limit number of iterations, finish the iteration decoding when iterating the upper-limit number of iterations. It is because a case occurs where when a large noise is added to a coded sequence on a transmission path, continuing the iteration decoding does not result in no error in all the error detecting codes. By thus providing the number of iterations with an upper limit, it is possible to prevent wasteful iterations from being continued, and thereby prevent processing delay and power consumption from increasing.

"The constraint number of iterations" of the number of iterations in turbo decoder 301 will be described specifically.

In coding logic, it is known that when a number of errors occur which exceed a minimum distance of a codeword obtained by performing error detecting coding on information bits, it is not possible to properly check the errors even when the error detecting code is decoded. In other words, when a number of errors exceeding a minimum distance occur in a codeword, the erroneous codeword sometimes coincides with another codeword. In this case, despite errors existing, it is judged that no error exists, and so-called "overlooked error" occurs. Generally, a state where despite errors being contained in a decoded result, the errors are not detected and contained in a final decoded result is referred to as that "overlooked error" occurs.

Meanwhile, as illustrated in FIG. 1, the turbo code has the characteristic that the increased number of iterations in the iteration decoding decreases the bit error rate. In other words, as the number of iterations is increased, errors contained in a decoded result are decreased.

Accordingly, it is understood that the reliability of error detection performed at an earlier stage (stage with high error rate) of the iteration decoding is low, and that the reliability of error detection is increased as the number of iterations is increased.

Then, in the iteration decoding in this embodiment, since the reliability of check as to the presence or absence of error using the error detecting code is low at an earlier stage of the iteration decoding, the iteration decoding is continued even when no error is judged. Then, when it is judged no error exists in a decoded result after performing the iteration decoding more than or equal to the predetermined number of times and decreasing errors contained in a decoded result, the iteration decoding is finished and a finale decoded result is obtained. In the specification, the predetermined number of times is referred to as "the constraint number of iterations". It is possible to reduce occurrences of overlooked error by performing the iteration decoding more than or equal to "the constraint number of iterations". As described above, in the present invention the iteration decoding is performed until the number of iterations is more than or equal to "the constraint number of iterations" and it is judged that no error exists in a decoded result of the iteration decoding using the error detecting code.

Table 1 shows a simulation result of the number of erroneous bits, BER and the number of overlooked-error occurrences measured for each iteration. The simulation result is obtained by performing error detecting coding using CRC code with 8 bits on a transmission information bit sequence with 640 bits, further performing turbo coding and then simple modulation on the sequence, adding the white Gaussian noise to the sequence, and performing turbo decoding and then CRC on the sequence. The simulation result indicates an example of a case where the number of iterations is eight, and measurement is performed under condition of noise level such that BER is approximately $10^{-6}$. The relationship between the number of iterations and the number of overlooked-error occurrences is not limited to that shown in Table 1, and varies corresponding to the condition of simulation.

TABLE 1

The number of erroneous bits, BER and the number of overlooked-error occurrences in error detection for each iteration

|  | The number of erroneous bits | BER | The number of overlooked-error occurrences |
| --- | --- | --- | --- |
| First Iteration | 10776260 | 0.0655324 | 1000 |
| Second Iteration | 2746229 | 0.0167003 | 724 |
| Third Iteration | 434988 | 0.0026452 | 113 |
| Fourth Iteration | 55726 | 0.0003389 | 25 |
| Fifth Iteration | 8359 | 0.0000508 | 1 |
| Sixth Iteration | 1761 | 0.0000107 | 0 |
| Seventh Iteration | 520 | 0.0000032 | 0 |
| Eighth Iteration | 261 | 0.0000016 | 0 |

Table 2 shows the number of overlooked-error occurrences, the number of error detecting codes with the error, and a ratio of the number of overlooked-error occurrences to the number of error detecting codes with the error for each iteration. The simulation result indicates an example of a case performed under the same condition as the case shown in Table 1. Values shown in the table vary corresponding to the condition of simulation.

TABLE 2

The number of overlooked-error occurrences, the number of error detecting codes with the bit error, and the ratio therebetween for each iteration

|  | Ratio | The number of overlooked-error occurrences | The number of error detecting codes with the error |
| --- | --- | --- | --- |
| First Iteration | 0.00394 | 1000 | 253759 |
| Second Iteration | 0.00323 | 724 | 223930 |
| Third Iteration | 0.00155 | 113 | 72817 |
| Fourth Iteration | 0.00266 | 25 | 11042 |
| Fifth Iteration | 0.00060 | 1 | 1664 |
| Sixth Iteration | 0.00000 | 0 | 319 |
| Seventh Iteration | 0.00000 | 0 | 76 |
| Eighth Iteration | 0.00000 | 0 | 36 |

As can be seen from Tables 1 and 2, as the number of iterations is increased, the number of occurrences of overlooked error is decreased, and the ratio of the occurrences of the overlooked error to number of the error detecting codes with the error is decreased.

An example will be described below of the constraint number of iterations set in examples shown in Tables 1 and 2. In addition, a method of setting the constraint number of iterations described below is an example, and a method of setting the constraint number of iterations of the present invention is not limited to this example. The constraint number of iterations is the minimum number of times the iteration decoding is performed to reduce the overlooked errors as described above. The number of allowable overlooked errors differs corresponding to system setting, but it is not considered in general systems that the constraint number of iterations is set at the number of times the overlooked error never occurs because such setting increases the processing delay and power consumption. Meanwhile, in examples shown in Tables 1 and 2, since a number of overlooked errors occur in first and second iterations, it is not proper either in general systems to set the constraint number of iterations at 1 or 2. Accordingly, in systems under the transmission path environments of examples as shown in Tables 1 and 2, the constraint number of iterations is determined in a range from 3 to 5. Further, since increasing the constraint number of iterations increases the quality of decoded results and further increases power consumption in an apparatus, it is proper to set the constraint number of iterations at 3 to 5 in consideration of the quality of decoded results required for the system and power consumption.

The aforementioned constraint number of iterations is selected and set as appropriate corresponding to the system setting. For example, in the case of combining a decoding apparatus according to this embodiment and an apparatus that performs inner-loop transmission power control, the constraint number of iterations is determined corresponding to set reference such as target reception quality of transmit power. In closed-loop transmission power control among the inner-loop transmission power control, a receiving side sets in advance required reception quality (for example, SIR (Signal to Interference Ratio) of a received signal) as the target reception quality, compares the target reception quality with actually measured reception quality, and when the measured reception quality is lower than the target reception quality, transmits a transmission power control signal for instructing to increase the transmission power to a communicating party, while transmitting a transmission power control signal for instructing to decrease the transmission power to the communicating party when the measured reception quality is higher than the target reception quality, and the transmitting side increases/decreases the transmission power corresponding to the transmission power control signal. In such closed-loop transmission power control, when the set target reception quality is a relatively high value, errors can be corrected at a stage of the relatively small number of iterations in the error correcting decoding using the iteration decoding. Accordingly, as the set target reception quality is a higher value, since the error rate is improved the smaller number of iterations to an extent overlooked errors fall within in an allowable range. On the other hand, in such closed-loop transmission power control, when the set target reception quality is a relatively low value, errors cannot be corrected until the relatively large number of iterations is performed in the error correcting decoding using the iteration decoding. Accordingly, as the set target reception quality is a lower value, since overlooked errors still remain after the larger number of iterations, the constraint number of iterations is set at a larger number.

In view of the foregoing, in the case of combining the decoding apparatus according to this embodiment and an apparatus that performs closed-loop transmission power control, the constraint number of iterations is determined corresponding to set target reception quality. Further, in the case of using the decoding apparatus according to this embodiment in a communication system with no power control, the constraint number of iterations may be determined based on an average reception quality value in the system.

Figure 7:
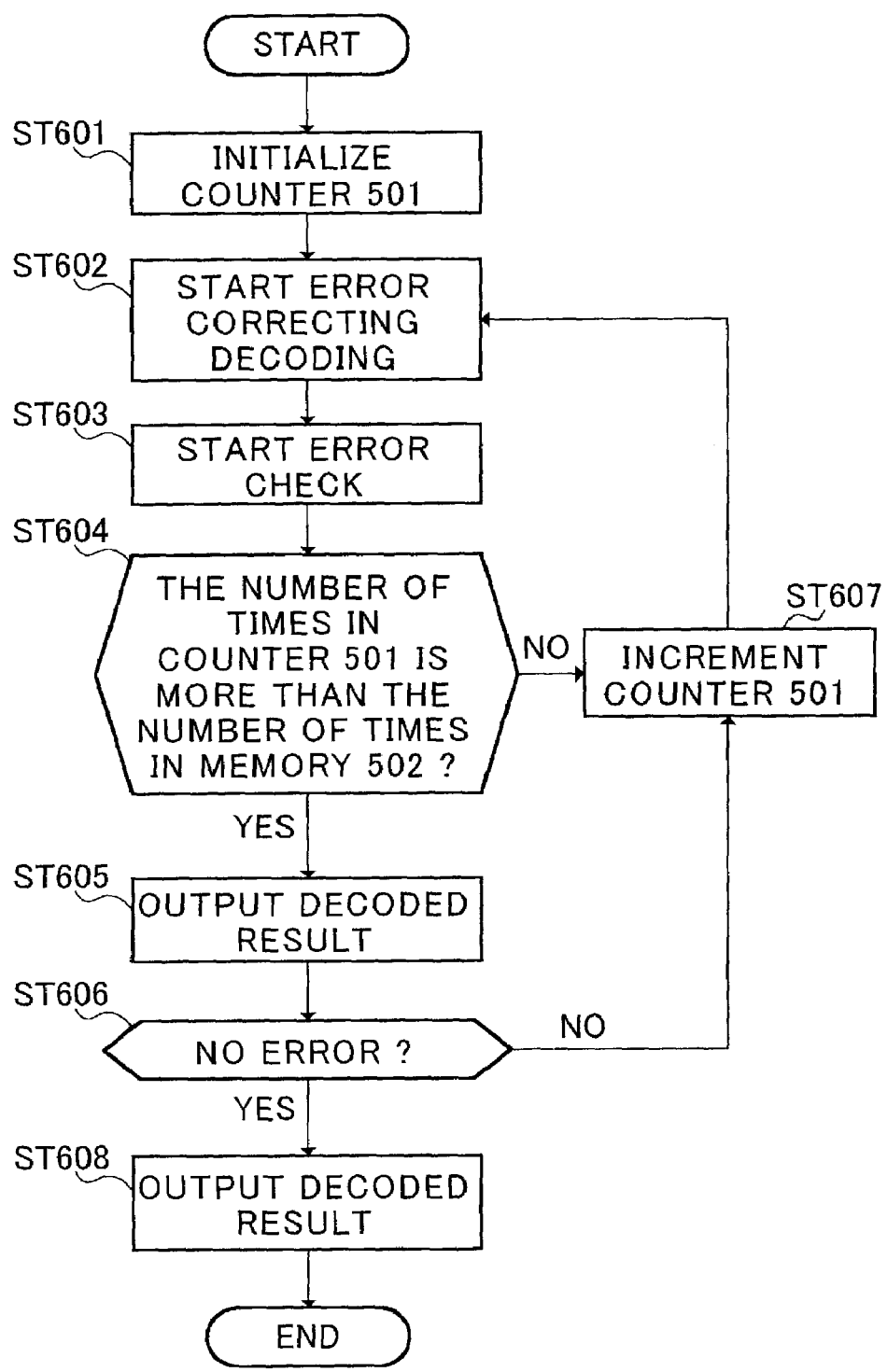
FIG. 7 is a flow diagram to explain procedures of iteration decoding according to Embodiment 1 of the present invention.

Procedures of the iteration decoding according to this embodiment will be described below with reference to FIG. 7. FIG. 7 is a flow diagram to explain procedures of the iteration decoding in Embodiment 1 of the present invention.

First, in step (hereinafter abbreviated as "ST") 601, a set value (the number of iterations) of counter 501 is initialized. In ST602 turbo decoder 301 performs error correcting decoding using a received signal and soft-decision result (prior likelihood) obtained in last error correcting decoding. In addition, in the first iteration, "0" is used as prior likelihood. In ST603 error checker 302 decodes error detecting codes and checks whether an error exists. In ST604 the set value (the number of iterations) of counter 501 is compared with "the constraint number of iterations" stored in memory 502, and when the number of iterations counted in counter 501 is larger, the processing flow shifts to ST605, while shifting to ST607 when the number of iterations is smaller.

In ST605 a decoded result in turbo decoder 301 is output to the decoded result output memory not shown.

In ST606 a check result as to whether an error exists is referred, and it is determined whether an error is contained in the decoded result in turbo decoder 301. When an error is determined to exist, the processing flow shifts to ST607, while when no error is determined, shifting to ST608 where the decoded result output from turbo decoder 301 is output to the decoded result output memory not shown, and the iteration decoding is finished. In ST607 the set value of counter 501 is incremented, the processing flow shifts to ST602, and the iteration decoding is continued. Thus, in the iteration decoding in the present invention, when the decoding is iterated the number of times exceeding the constraint number of iterations and no error is detected in the decoded result, turbo decoder 301 finishes the iteration decoding.

As described above, in this embodiment, when the number of iterations is smaller than "the constraint number of iterations", since the iteration decoding is continued independent of a result of error check using the error detecting code, it does not happen that the iteration decoding is finished at an earlier stage of the iterations in which the overlooked error tends to occur. Accordingly, the iteration decoding is rarely finished with the overlooked error remaining in a decoded result, and it is thereby possible to obtain a decoded result with high reliability. Further, when the number of iterations becomes larger than "the constraint number of iterations", the iteration decoding is finished when no error is determined in the error check using the error detecting code, and it is thereby possible to reduce the processing time.

In addition, in the above description the turbo coder provided in coding section 101 has two parallel-arranged recursive systematic convolutional coders. However, it may be possible to provide three or more recursive systematic convolutional coders to encode transmission information bit sequences. Further it may be possible to perform thinning processing such as puncture on coded sequences. Such cases may require a configuration with a number of error correcting decoders that perform soft-output decoding corresponding to the number of coders at a transmitting side, and a circuit for embedding zero in thinned data.

As a decoding algorithm in soft-output decoders 401 and 403, MAP (Maximum A Posteriori Probability decoding) algorithm or SOVA (Soft Output Viterbi Algorithm) may be used.

In this embodiment, while turbo decoder 301 is used as a decoder provided at a receiving side, a decoder applicable to the present invention is not limited to a turbo decoder. Any decoder is applicable that decodes received coded sequences by iterating error correcting decoding. When a decoder other than a turbo decoder is used as a decoder according to the present invention, a transmitting side is provided with a coder corresponding to the used decoder.

Further in this embodiment, error checker 302 checks the presence or absence of error even when the number of iterations does not reach "the constraint number of iterations". However, since turbo decoder 301 continues the iteration processing until the number of iterations reaches "the constraint number of iterations" independent of a result of the error check, it may be possible that error checker 301 does not check the present or absence of error when the number of iterations does not reach "the constraint number of iterations". It is thus possible to reduce the power consumption to be consumed in iterating decoding.

Furthermore in this embodiment, when the iteration decoding is performed after "the constraint number of iterations", a decoded result is always output and a decoded result obtained when the decoding is finished is overwritten finally in the decoded result output memory. However, it may be possible to output only the decoded result obtained when the decoding is finished. Moreover, in contrast to the foregoing, a decoded result is always output even when the number of iterations is less than "the constraint number of iterations", and a decoded result obtained when the decoding is finished is overwritten finally.

Still furthermore in this embodiment, while the error detection is always performed each time of iteration decoding, it may be possible not to perform error detection when the number of iterations is less than the constraint number of iterations. In this way, since the number of error detection times is decreased, it is possible to reduce the processing load and suppress power consumption.

(Embodiment 2)

This embodiment explains a method of optimizing the number of iterations in the iteration decoding when a coded sequence (error correcting code) input to a decoder that performs the iteration decoding contains a plurality of error detecting codes.

Figure 8:
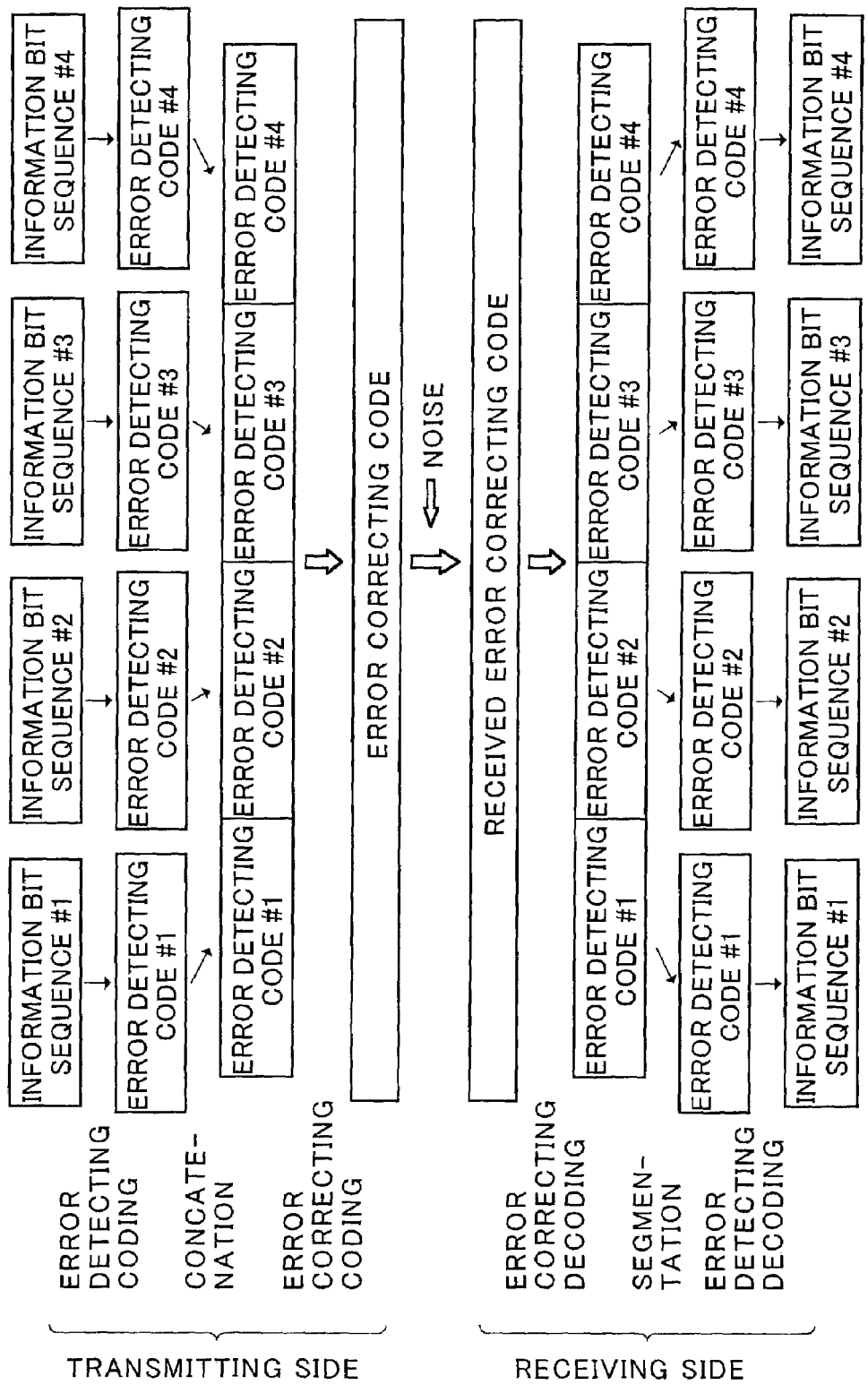
FIG. 8 is a diagram illustrating the flow of coding to decoding in a radio communication system according to Embodiment 2 of the present invention.

FIG. 8 is a diagram illustrating changes in data resulting from coding to decoding in a radio communication system according to Embodiment 2 of the present invention. As shown in FIG. 8, information bit sequences #1 to #4 are first subjected to error detecting coding at a transmitting side, and thereby error detecting codes #1 to #4 are generated respectively. Error detecting codes #1 to #4 are concatenated and subjected to error correcting coding, and thereby a coded sequence subjected to error correcting coding is obtained. The coded sequence (error correcting code) contains four error detecting codes. The number of error detecting codes contained in the error correcting code is not limited to four, and may be an arbitrary number more than or equal to 1. Hereinafter, this embodiment explains as an example a case where four error detecting codes are contained in the error correcting code.

The coded sequence subjected to error correcting coding is given noises on a transmission path and is received at a receiving side. The receiving side iterates error correcting decoding on the received coded sequence, and obtains a collective decoded result. The decoded result contains error detecting codes #1 to #4. The decoded result is segmented into error detecting codes #1 to #4. Error detecting codes #1 to #4 are decoded and information bit sequences #1 to #4 are obtained. Further by decoding error detecting codes #1 to #4, it is possible to check whether an error remains in information bit sequences #1 to #4 contained in respective error detecting codes.

Figure 9:
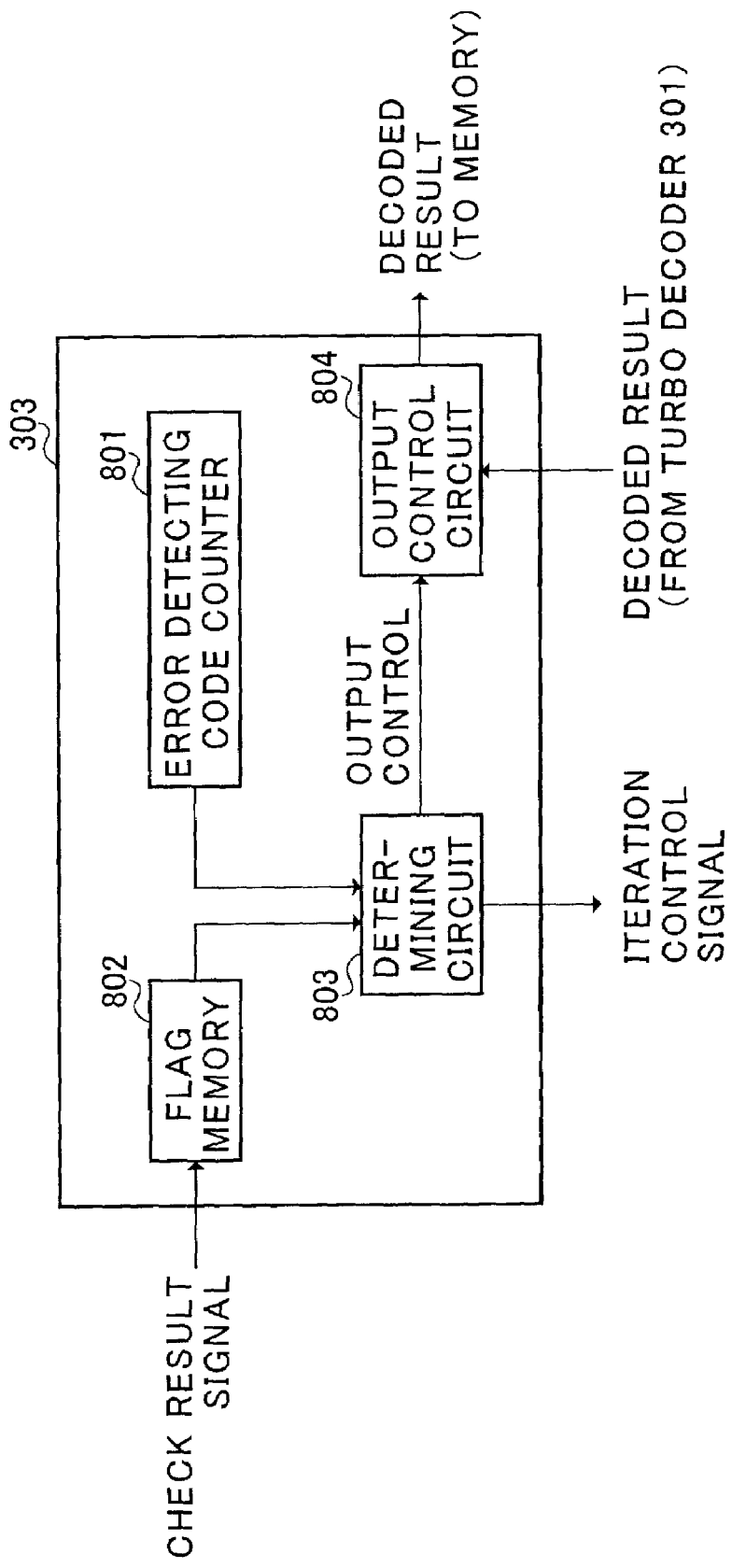
FIG. 9 is a block diagram illustrating a configuration of iteration controller 303 according to Embodiment 2 of the present invention.

FIG. 9 is a block diagram illustrating a configuration of iteration controller 303 according to Embodiment 2 of the present invention. The radio communication system according to this embodiment has the same configuration as that in Embodiment 1 except the configuration of iteration controller 303. Therefore, the same sections as in Embodiment 1 are assigned the same reference numerals to omit descriptions.

As shown in FIG. 9, iteration controller 303 according to this embodiment is primarily comprised of error detecting code counter 801 that counts the number of error detecting codes contained in an error correcting code, flag memory 802 that stores a number of error check result flags corresponding to error detecting codes, determining circuit 803 that determines whether or not to finish the iteration decoding in turbo decoder 301, for example, referring to the error check result flag, and output control circuit 804 that outputs a decoded result in turbo decoder 301 as a final decoded result corresponding to control of determining circuit 803.

The operation of iteration controller 303 with the above configuration will be described below. Error detecting code counter 801 counts the number of error detecting codes contained in a decoded result in turbo decoder 301, and outputs the count number to determining circuit 803. In other words, error detecting code counter 801 is set for "1" as an initial value of count number, and during a period of time turbo decoder 301 performs one iteration, increments the count number from "1" by "1" up to the number corresponding to error detecting codes contained in the error correcting code whenever the error detecting code is output as a result of the error correcting decoding. For example, when the error correcting code contains four error detecting codes as shown in FIG. 8, error detecting counter 801 outputs "1", "2", "3" and "4" in this order during one iteration.

Flag memory 802 stores a same number of error check result flags as that of error detecting codes. The error check result flags are used as a mark for distinguishing an error decoding code determined to have no error among error detecting codes contained in the coded sequence undergoing the iteration decoding in turbo decoder 301. The error check result flags will be described specifically.

Error checker 302 checks errors for each of the error detecting codes contained in a decoded result in turbo decoder 301, and outputs a check result signal (OK signal or NG signal) indicative of the error check result to flag memory 802 for each error decoding code. Error check result flags are each set at "0" as an initial value. Error check result flags are updated corresponding to the check result signal output from error checker 302. In other words, when an OK signal is input to flag memory 802 as a check result signal, an error check flag corresponding to the error detecting code is updated to "1". The error check result flag that is once updated to "1" during the iteration decoding keeps "1" until the iteration decoding on the coded sequence undergoing the decoding is finished. Thus, the error check result flag indicates whether the decoded result shows no error at least once during the iteration decoding. In other words, an error detecting code whose error check result flag is set at "1" has shown no error already at least once, and an error detecting code whose error check result flag is set at "0" has not shown no error even once.

Using error check result flags read from flag memory 802, the count number of error detecting codes output from error detecting code counter 801, and the error detecting result output from error checker 302, determining circuit 803 makes determinations as to whether or not to finish the iteration decoding in turbo decoder 301, and as to whether or not to output a decoded result output from turbo decoder 301 to output control circuit 804.

First, the determination as to whether or not to finish the iteration decoding will be described below. Whenever one iteration is finished in the iteration decoding, determining circuit 803 determines to finish the iteration decoding in turbo decoder 301 when with respect to all the error detecting codes contained in a coded sequence undergoing the decoding, the error check result flag is "1" or a result of current error detection shows the absence of error, while determining to continue the iteration decoding when at least one of error check result flags is not "1" and a result of current error detection shows the presence of error. In the case where with respect to all the error detecting codes contained in a coded sequence undergoing the decoding, the error check result flag is "1" or a result of current error detection shows the absence of error, error checker 302 has determined no error at least once in all the error detecting codes. Accordingly, since all the error decoding codes result in no error at least once already, the circuit 803 determines to finish the iteration decoding. When determining to finish the iteration decoding, determining circuit 803 performs control for instructing turbo decoder 301 to finish the iteration decoding on the current coded sequence. Turbo decoder 301 finishes the iteration decoding according to the control of determining circuit 803.

The determination as to whether or not to output a decoded result output to output control circuit 804 will be described below. When the error check result flag corresponding to the error detecting code is already set at "1", i.e., when no error is already detected at least once up to last iteration decoding, determining circuit 803 determines not to output the error detecting code (decoded result in turbo decoder 301) corresponding to the error check result flag set at "1". On the other hand, when the error check result flag corresponding to the error detecting code is set at "0", i.e., when no error is not detected even once up to the last iteration decoding, the circuit 803 determines to output the error detecting code (decoded result in turbo decoder 301) corresponding to the error check result flag set at "0". When determining to output a decoded result, determining circuit 803 instructs output control circuit 804 to output only the decoded result determined to be output among decoded results output from turbo decoder 301. Decoded results (herein, error detecting codes #1 to #4) of the iteration decoding are output to output control circuit 804 from turbo decoder 301. Among the error detecting codes output from turbo decoder 301, output control circuit 804 outputs the error detecting code, which determining circuit 803 instructs to output, to the memory not shown as a decoded result. The memory is provided to hold decoded results output from iteration controller 303. In this way, such a state is generated that a decoded result first indicating no error is output to a region for final decoded result output, for each error detecting code.

FIG. 11 is a table illustrating an example of updating processes of error check result flags stored in flag memory 802. FIG. 11 illustrates the updating processes of error check result flag for each decoded result (error detecting codes #1 to #4) in turbo decoder 301. As illustrated in the figure, each error check result flag is set at "0" as an initial value. Since the information bit sequence contained in error detecting code #1 is determined to have no error in first iteration, the error check result flag corresponding to error detecting code #1 is updated to "1" at the time of finishing the first iteration, and is not changed while keeping "1" thereafter. Since the information bit sequence contained in error detecting code #2 is first determined to have no error in third iteration, the error check result flag corresponding to error detecting code #2 is updated to "1" at the time of finishing the third iteration. Similarly, the error check result flag corresponding to error detecting code #3 is updated to "1" at the time of finishing the sixth iteration, and the error check result flag corresponding to error detecting code #4 is updated to "1" at the time of finishing the second iteration. Thus, in the example illustrated in FIG. 11, at the time of finishing the sixth iteration, all the error check result flags are updated to "1". Accordingly, at the time of finishing the sixth iteration, since all the error detecting codes are determined to have no error at least once, the iteration decoding is finished after the sixth iteration.

When error check result flags proceed according to the updating processes illustrated in FIG. 11, with respect to error detecting code #1, a decoded result obtained by the first iteration is output, and decoded results obtained by second and thereafter iterations are not output. With respect to error detecting code #2, decoded results obtained by first to third iterations are output, decoded results obtained by fourth and thereafter iterations are not output, and as a result, the decoded result obtained by the third iteration is stored in the memory for holding final decoded results. With respect to error detecting code #3, decoded results obtained by first to sixth iterations are output, decoded results obtained by seventh and thereafter iteration are not output, and as a result, the decoded result obtained by the sixth iteration is stored in the memory for holding final decoded results. With respect to error detecting code #4, decoded results obtained by first and second iterations are output, decoded results obtained by third and thereafter iterations are not output, and as a result, the decoded result obtained by the second iteration is stored in the memory for holding final decoded results. As a result, with respect to error detecting codes #1 to #4, the memory for holding final decoded results stores decoded results obtained by first, third, sixth and second iterations, respectively.

Figure 10:
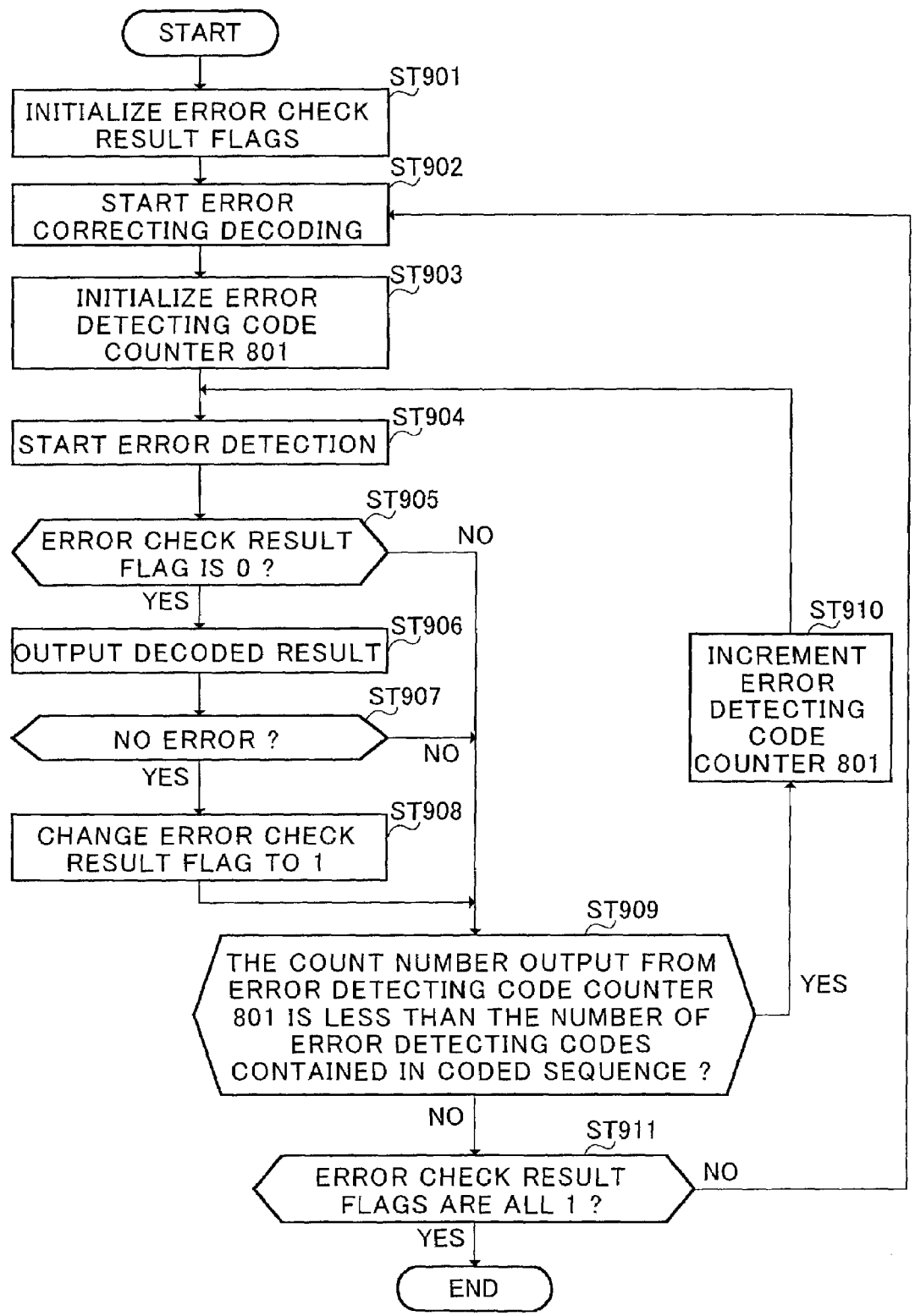
FIG. 10 is a flow diagram to explain procedures of iteration decoding according to Embodiment 2 of the present invention.

Procedures of the iteration decoding in this embodiment will be described below with respect to FIG. 10. FIG. 10 is a flow diagram to explain procedures of the iteration decoding in Embodiment 2 of the present invention.

First in step (ST) 901, error check result flags stored in flag memory 802 are initialized, the processing flow shifts to ST902. In ST902 using a received signal and soft-output decoded result (prior likelihood) in last error correcting decoding, error correcting decoding is started. In addition, in the first iteration "0" is used as prior likelihood. In ST903 counter 801 that outputs the counter number of error detecting code is initialized. In ST904 whenever turbo decoder 301 outputs an error detecting code, the decoding is started on the error detecting code contained in the decoded result of the iteration decoding, and the processing is started for checking whether or not an error remains in the result of iteration decoding of the error detecting code.

In ST905 error detecting code counter 801 outputs "1" as the count number, an error check result flag of error detecting code #1 corresponding to "1" is checked, and when the error check result flag is "0" (no error is not detected yet), the processing flow shifts to ST906, while shifting to ST909 when the error check result flag is "1" (no error is detected already). In addition, in the first error correcting processing, since flag memory 802 stores "0" as an initial value, the processing flow always shifts to ST906. In ST906, among decoded results obtained by the iteration decoding is output a decoded result of error detecting code #1 corresponding to "1" output from the error detecting code counter, and the processing flow shifts to ST907. In ST907, the processing flow shifts to ST908 when the absence of error is determined in error check in ST903, while shifting to ST908 when the presence of error is determined in ST903. In ST908 the error check result flag corresponding to error detecting code #1 is changed to "1" (no error is already detected).

In ST909 the count number output from error detecting code counter 801 is compared with the number of error detecting codes contained in the coded sequence currently undergoing the iteration decoding, and the processing flow shifts to ST910 when the count number is smaller than the number of error detecting codes contained in the coded sequence, while shifting to ST911 when the count number coincides with the number of error detecting codes. In ST910 error detecting code counter 801 is incremented, and the processing flow shifts to ST904, thereby shifting to the error detection of an error detecting code next output from turbo decoder 301. According to branching in ST909, the update of error check result flag in a loop composed of ST904, ST905, ST906, ST907, ST908, ST909 and ST910 is performed until the count number coincides with the number of error detecting codes contained in a coded sequence. Accordingly, by the processing performed in the loop, an error check result of the decoded result output by iterating the iteration decoding once is reflected in the error check result flag. As shown in FIG. 8, when the coded sequence contains four error detecting codes, error detecting code counter 801 outputs "1", "2", "3" and "4" in this order. Then, when the processing in the loop composed of ST904, ST905, ST906, ST907, ST908, ST909 and ST910 is performed with respect to "4" that is the final count number, since the counter number is coincident with the number of error detecting codes contained in the error correcting code and turbo decoder 301 finishes outputs in the current iteration of the iteration decoding, the processing flow shifts from ST909 to ST911.

Meanwhile, in ST911 error check result flags are checked respectively corresponding to error detecting codes #1 to #4 contained in the coded sequence, and when with respect to either error detecting code, its error check result flag is set at "0" (no error is not detected yet), the processing flow shifts to ST902. In ST902 next error correcting decoding is started. In other words, when the processing flow shifts to ST902, the iteration decoding is continued, and the processing is resumed of updating the error check result flag corresponding to the error detection result in the above-mentioned decoded result. In ST911, when error check result flags of all the error detecting codes are "1" (no error is detected already), the iteration decoding is finished.

As described above, in this embodiment, the error correcting decoding is iterated on a coded sequence containing a plurality of error detecting codes, and when with respect to all the error detecting codes contained in the coded sequence, no error is determined at least once, the iteration decoding is finished. Thus, according to the method of controlling the number of iterations according to this embodiment, it is possible to decrease the number of iterations as compared to a method of finishing the iteration decoding when no errors are determined in the same number of iterations of the iteration decoding in all the error detecting codes contained in the coded sequence undergoing the iteration decoding.

In addition, while in this embodiment error detecting decoding is performed independent of value of the error check result flag, since an error detection result after the error check result flag is updated to "1" is not considered in controlling the number of iterations of the iteration decoding, it may be possible not to perform the error detection after the error check result flag is updated to "1". It is thereby possible to reduce the processing load and suppress power consumption in a decoding apparatus.

Further, this embodiment explains the case where when a decoded result of the iteration decoding first indicates no error, the decoded result determined to have no error is output as a final decoded result from output control circuit 804 and is stored in the memory. However, it may be possible that when an error detection result determines again no error in a decoded result in further iterating decoding, the decoded result is output to overwrite despite the no-error determination being second one or thereafter.

Furthermore, in this embodiment the iteration decoding is finished when with respect to all the error detecting codes contained in a coded sequence, no error is determined at least once. However, it may be possible to set in advance the upper limit number of iterations, and even when an error detecting code exists in which no error has not been determined yet until the upper limit number of iterations, the iteration decoding is finished after the iteration decoding is performed the upper limit number of iterations. By thus providing the number of iterations with an upper limit, it is possible to prevent the processing delay and power consumption from increasing due to an increased number of iterations. When a large noise is added to a coded sequence on a transmission path, there is a case that continuing the iteration decoding does not result in no errors in all the error detecting codes. Therefore, providing an upper limit is effective in a case of using this embodiment in communication systems with varied transmission path environments.

This embodiment may be used in a combination with Embodiment 1. In other words, the number of iterations is provided with the constraint number of iterations, and when the number of iterations is more than or equal to the constraint number of iterations and the error check determines no error in a decoded result of the iteration decoding, the error check result flag is updated to "1". Meanwhile, when the number of iterations is less than the constraint number of iterations, the error check result flag is held at "0" and is not updated. By thus holding the error check result flag "0" without updating when the number of iterations is less than the constraint number of iterations, it is possible to prevent the processing delay from occurring due to an increased number of iterations, and further prevent the transmission quality from deteriorating due to overlooked errors tending to occur at an earlier stage of the iteration decoding.

In using this embodiment in a combination with Embodiment 1 as described above, when no errors are determined in all a plurality of error detecting codes in the same number of iterations, it may be possible to finish the iteration decoding despite the number of iterations less than the constraint number of iterations. It is thereby possible to decrease the number of iterations and to reduce the processing time of decoding The radio communication system according to each of the above embodiments is applied to a cellular system. A base station apparatus is provided with decoding section 108, and a communication terminal such as a mobile station accommodated in a cell of the base station apparatus is provided with coding section 101. Further, in contrast thereto, a base station apparatus is provided with coding section 101, and a communication terminal such as a mobile station accommodated in a cell of the base station apparatus is provided with decoding section 108. The base station and communication terminal perform operations of the above-mentioned coding to decoding, thereby iterating the iteration decoding the suitable number of times, and thus secure the desired transmission quality and reduce the processing delay.

As described above, according to the present invention, at a stage of a small number of iterations in the iteration decoding, the iteration decoding is continued even when no error is detected from a decoded result of the iteration decoding. It is thereby possible to prevent the transmission quality from deteriorating due to overlooked errors. Further, the number of iterations is provided with the constraint number of iterations, and when the number of iterations exceeds the constraint number of iterations and an error check result determines no error, the iteration decoding is finished. Unnecessary iterations are thus prevented, whereby it is possible to decrease the number of iterations and reduce the processing delay.

Further, according to the present invention, the error correcting decoding is iterated on a coded sequence containing a plurality of error detecting codes, and when with respect to all the error detecting codes contained in the coded sequence, no error is determined at least once, the iteration decoding is finished. Accordingly, it is possible to decrease the number of iterations as compared to a method of finishing the iteration decoding when no errors are determined in the same number of iterations of the iteration decoding in all the error detecting codes contained in the coded sequence undergoing the iteration decoding.

This application is based on the Japanese Patent Application No. 2000-366347 filed on Nov. 30, 2000, entire content of which is expressly incorporated by reference herein.

INDUSTRIAL APPLICABILITY

The present invention is applicable to a decoding apparatus and decoding method for iterating decoding on a coded sequence obtained by performing error detecting coding and error correcting coding on information bits, and more particularly, to a decoding apparatus and decoding method for decoding a coded sequence subjected to error correcting coding by turbo code.

What is claimed is:

1. A decoding apparatus comprising:
    an iteration decoder that iteratively performs error correcting decoding on a received coded sequence to produce a plurality of error detecting codes in each iteration, the coded sequence generated by error detecting coding and error correcting coding information bits;
    a checker that checks for an error in each of the error detecting codes produced in each iteration of error correcting decoding the received coded sequence and produces a check result for each of the error detecting codes produced in each iteration of error correcting decoding the received coded sequence;
    a holder that (i) stores the error check result for each of the error detecting codes produced in each iteration of error correcting decoding the received coded sequence and (ii) associates each error check result produced in the latest iteration with error check results for the corresponding error detecting code produced in every prior iteration to provide groups respectively comprising corresponding error check results; and
    a controller that induces the iteration decoder to perform another iteration of error correcting decoding when, for at least one of said groups of error check results, the stored error check results indicate that an error was detected for each of the error check results within said any one or more of said groups.

2. The decoding apparatus of claim 1, wherein the controller stops the iteration decoder from performing another iteration of error correcting decoding the received coded sequence when a predetermined number of iterations have been completed.

3. The decoding apparatus of claim 1, wherein the controller induces the iteration decoder to perform no fewer than a constraint number of iterations of error correcting decoding the received coded sequence.

4. The decoding apparatus of claim 1, wherein the controller induces the iteration decoder to perform no fewer than a constraint number of iterations of error correcting decoding the received coded sequence, except when the stored error check results indicate that no errors were detected in any of the error detecting codes produced in the latest iteration.

5. The decoding apparatus of claim 1, further comprising an outputter that outputs results of the error correcting decoding only after the iteration decoder has performed no fewer than a constraint number of iterations of error correcting decoding the received coded sequence.

6. The decoding apparatus of claim 1, further comprising an outputter that outputs an error detecting code, produced in a latest iteration of error correcting decoding the received coded sequence, only if:
    the stored error check result for this error detecting code indicates that no error was detected therein, and
    the stored error check result for each of the corresponding error detecting codes of said any one or more of said groups indicates that an error was detected in the respective error detecting code.

7. The decoding apparatus of claim 1, wherein once the checker detects the absence of an error in an error detecting code produced in an iteration of error correcting decoding the received coded sequence, the checker discontinues checking for an error in each corresponding error detecting code produced in subsequent iterations.

8. A decoding method comprising:
    a) error correcting decoding a received coded sequence to produce a plurality of error detecting codes, the coded sequence generated by error detecting coding and error correcting coding information bits;
    b) checking for an error in each of the produced error detecting codes and providing an error check result for each of the produced error detecting codes;
    c) storing the error check result for each of the produced error detecting codes;
    d) associating each error check result produced in the latest iteration with error check results for the corresponding error detecting code produced in every prior iteration to provide groups respectively comprising corresponding error check results; and
    e) performing another iteration of operations a) through e) when, for at least one of said groups of error check results, the stored error check results indicate that an error was detected for each of the error check results within said any one or more of said groups.

* * * * *